(12) United States Patent
Yu et al.

(10) Patent No.: US 6,902,966 B2
(45) Date of Patent: Jun. 7, 2005

(54) LOW-TEMPERATURE POST-DOPANT ACTIVATION PROCESS

(75) Inventors: Bin Yu, Cupertino, CA (US); Robert B. Ogle, San Jose, CA (US); Eric N. Paton, Morgan Hill, CA (US); Cyrus E. Tabery, Cupertino, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 09/983,625

(22) Filed: Oct. 25, 2001

(65) Prior Publication Data

US 2003/0082880 A1 May 1, 2003

(51) Int. Cl.⁷ .............................................. H01L 21/00
(52) U.S. Cl. ......................... 438/197; 438/166; 438/655
(58) Field of Search ................................ 438/197, 166, 438/655, 608, 648, 198, 150, 151, 479, 482, 486, 148, 149, 162, 164; 257/68, 66, 64, 59, 58

(56) References Cited

U.S. PATENT DOCUMENTS

| | | | |
|---|---|---|---|
| 5,937,315 A | 8/1999 | Xiang et al. | |
| 5,970,327 A * | 10/1999 | Makita et al. | 438/166 |
| 5,977,559 A * | 11/1999 | Zhang et al. | 257/57 |
| 5,986,286 A * | 11/1999 | Yamazaki et al. | 257/65 |
| 6,037,204 A * | 3/2000 | Chang et al. | 438/231 |
| 6,087,679 A * | 7/2000 | Yamazaki et al. | 257/65 |
| 6,093,937 A * | 7/2000 | Yamazaki et al. | 257/59 |
| 6,159,856 A | 12/2000 | Nagano | |
| 6,225,197 B1 * | 5/2001 | Maekawa | 438/487 |
| 6,251,757 B1 * | 6/2001 | Yu | 438/528 |
| 6,274,488 B1 * | 8/2001 | Talwar et al. | 438/655 |
| 6,287,925 B1 | 9/2001 | Yu | |
| 6,291,278 B1 | 9/2001 | Xiang et al. | |
| 6,300,659 B1 * | 10/2001 | Zhang et al. | 257/347 |
| 6,323,072 B1 * | 11/2001 | Yamazaki et al. | 438/166 |
| 6,350,677 B1 * | 2/2002 | Ko et al. | 438/630 |
| 6,365,446 B1 * | 4/2002 | Chong et al. | 438/197 |
| 6,365,476 B1 * | 4/2002 | Talwar et al. | 438/308 |
| 6,387,803 B2 * | 5/2002 | Talwar et al. | 438/682 |
| 6,399,450 B1 * | 6/2002 | Yu | 438/300 |
| 6,403,434 B1 * | 6/2002 | Yu | 438/300 |
| 6,420,218 B1 * | 7/2002 | Yu | 438/142 |

OTHER PUBLICATIONS

Heather Banisaukas et al, "Varying implant dose rate for defect reduction in laser thermal processing", Materials Science in Semiconductor Processing, Elsevier Science Ltd., vol. 4, No. 4, Aug. 21, pp. 339–343, ISSN: 1369–8001.
International Preliminary Examination Report dated Jan. 27, 2004 received in corresponding PCT Application No. PCT/US02/32555.

* cited by examiner

Primary Examiner—Laura M. Schillinger

(57) ABSTRACT

A method of manufacturing a MOSFET semiconductor device comprises forming a gate electrode over a substrate and a gate oxide between the gate electrode and the substrate; forming source/drain extensions in the substrate; forming first and second sidewall spacers; implanting dopants within the substrate to form source/drain regions in the substrate adjacent to the sidewalls spacers; laser thermal annealing to activate the source/drain regions; depositing a layer of nickel over the source/drain regions; and annealing to form a nickel silicide layer disposed on the source/drain regions. The source/drain extensions and sidewall spacers are adjacent to the gate electrode. The source/drain extensions can have a depth of about 50 to 300 angstroms, and the source/drain regions can have a depth of about 400 to 1000 angstroms. The annealing is at temperatures from about 350 to 500° C.

11 Claims, 5 Drawing Sheets

LOW-TEMPERATURE POST-DOPANT ACTIVATION PROCESS

FIELD OF THE INVENTION

The present invention relates to the manufacturing of semiconductor devices, and more particularly, to post-laser anneal processes that prevent dopant deactivation.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device generally includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the dimensions of the MOSFET shrinks, the reduction in effective gate length requires a proportional scaling in the vertical junction depth of the source/drain regions. The reduction in the junction depth of the source/drain regions is to reduce short channel effects.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping creates an amorphitizes the silicon substrate, and the activation annealing is used to recrystallize the amorphitized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about 8 orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem that exists with this process is that subsequent high-temperature processing can cause the dopants in the source/drain regions to become deactivated. A dopant is deactivated when it is removed from a lattice site, and deactivation of dopants typically occurs at temperature above about 700° C., which occurs with such processes as rapid thermal annealing. Accordingly, a need exists for improved post-dopant activation processes that prevent dopant deactivation.

SUMMARY OF THE INVENTION

This and other needs are met by embodiments of the present invention which provide a method of manufacturing a semiconductor device that reduces dopant deactivation. The method comprises forming a gate electrode over a substrate and forming a gate oxide between the gate electrode and the substrate; forming source/drain extensions in the substrate; forming first and second sidewall spacers; implanting dopants within the substrate to form source/drain regions in the substrate adjacent to the sidewalls spacers; and laser thermal annealing to activate the source/drain regions. A layer of nickel is then deposited over the source/drain regions and annealed at low temperature to reduce dopant deactivation.

In a further aspect of the present invention, the source/drain extensions can have a depth of about 50 to 300 angstroms, and the source/drain regions can have a depth of about 400 to 100 angstroms. Additionally, the temperature at which the nickel silicide is formed is from about 350 to 500° C.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 1A–1I schematically illustrate sequential phases of a MOS fabrication method using a low-temperature salicide process in conjunction with a laser thermal annealing activation process according to an embodiment of the present invention.

DETAILED DESCRIPTION OF THE INVENTION

The present invention addresses and solves the problem of dopant deactivation as a result of high-temperature post-dopant activation processes, such as rapid thermal annealing. This is achieved, in part, by activating source/drain regions using laser thermal annealing, which is followed by a low-temperature salicide formation process. In particular, nickel silicide is formed over the activated source/drain region by applying a nickel layer over the source/drain region followed by a low-temperature furnace anneal. The temperature is sufficiently high to produce nickel silicide but sufficiently low to minimize dopant deactivation within the source/drain regions.

An embodiment of the present invention is illustrated in FIGS. 1A–1I. A silicon substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
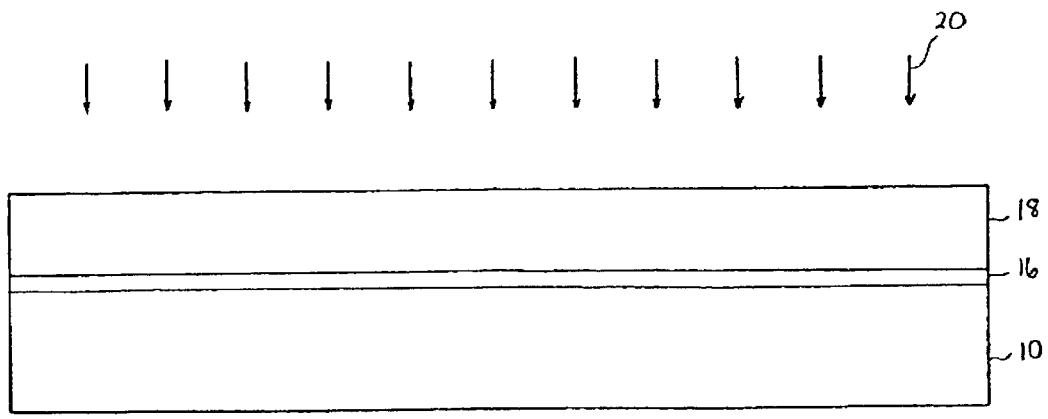

In FIG. 1A, a gate oxide 16, comprised of silicon dioxide, is formed on the top surface of the substrate 10, for example, using thermal oxidation at temperatures from about 700 to 1000° C. in an oxygen-steam ambient. Although not limited in this manner, the gate oxide 16 can have a thickness from about 30 to 200 angstroms. After deposition of the gate oxide 16, a gate electrode is formed over the gate oxide 16.

The formation of a gate electrode typically involves depositing a blanket layer of undoped polysilicon 18, for example by low pressure chemical vapor deposition (LPCVD) at temperatures from about 600 to 800° C., on the top surface of gate oxide 16. Although not limited in this manner, the polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The implantation of the nitrogen ions can be at a dosage from about $5\times10^{14}$ to $5\times10^{15}$ dopants/cm$^2$ and at an energy level from about 20 to 200 keV.

Figure 1B:
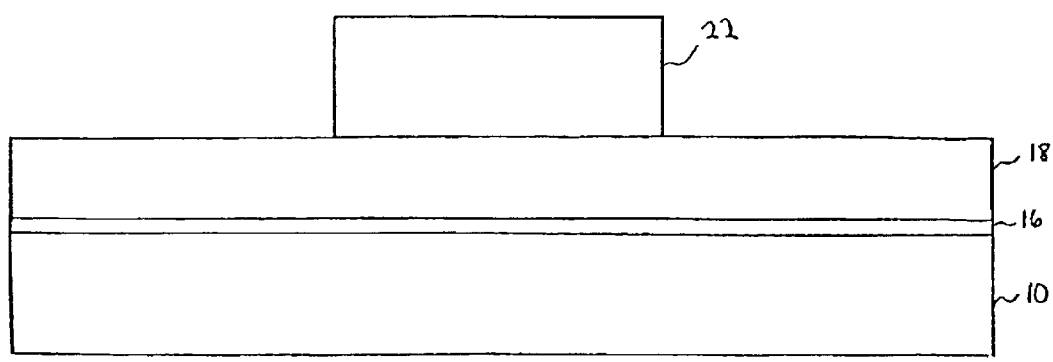

In FIG. 1B, the layers over the gate oxide 16 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 1C:
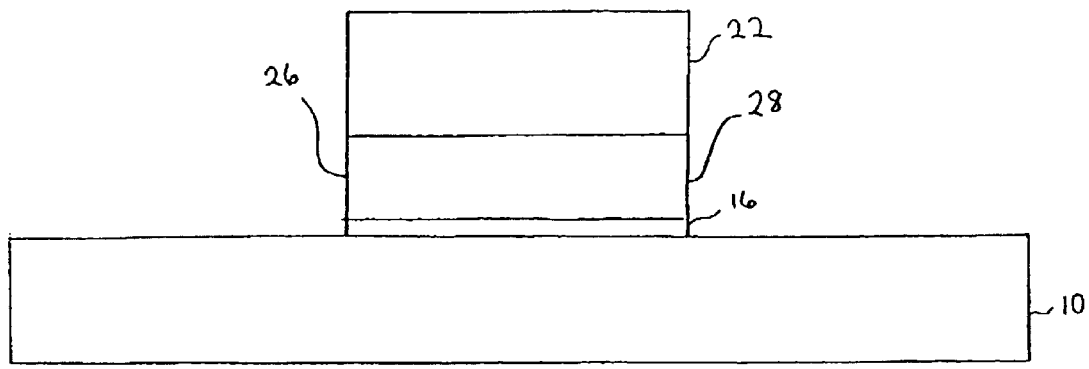

In FIG. 1C, an etch, typically anisotropic, is applied to remove the exposed portions of the polysilicon layer 18 and the underlying portions of the gate oxide 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be from about 500 to 2500 angstroms.

Figure 1D:
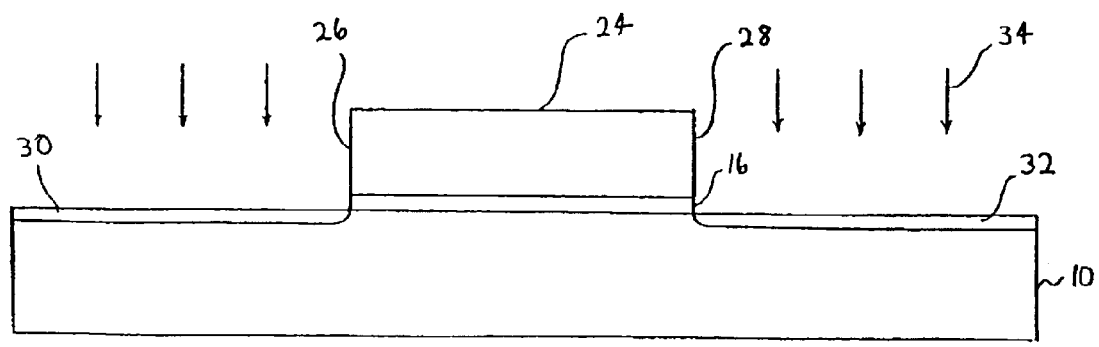

In FIG. 1D, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5\times10^{14}$ to $3\times10^{15}$ dopants/cm$^2$. The source/drain extensions 30, 32 are formed within the substrate 10 immediately adjacent to the sidewalls 26, 28 and are self-aligned with the gate electrode 24. After implantation, annealing can be conducted to activate the source/drain extensions 30, 32 and to recrystallize the extensions. Alternatively, the annealing can occur after the formation of the source/drain regions.

Typically, the source/drain extensions 30, 32 extend down from the surface of the silicon substrate 10 to a depth of about 50 angstroms to 300 angstroms.

Figure 1E:
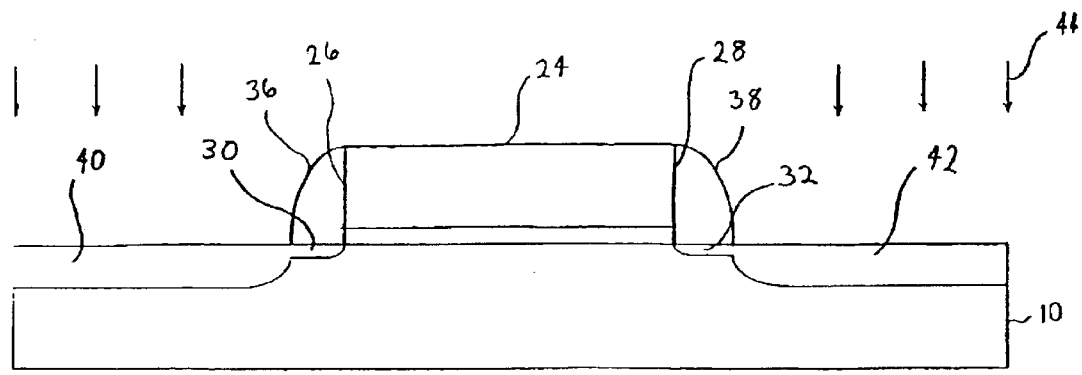

In FIG. 1E, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 26, 28 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 10 keV to 60 keV and from about $1 \times 10^{14}$ to $5 \times 10^{14}$ dopants/cm$^2$. The doping of the source/drain regions 40, 42 amorphitizes the silicon, which must then be recrystallized to activate the source/drain regions 40, 42.

Figure 1F:
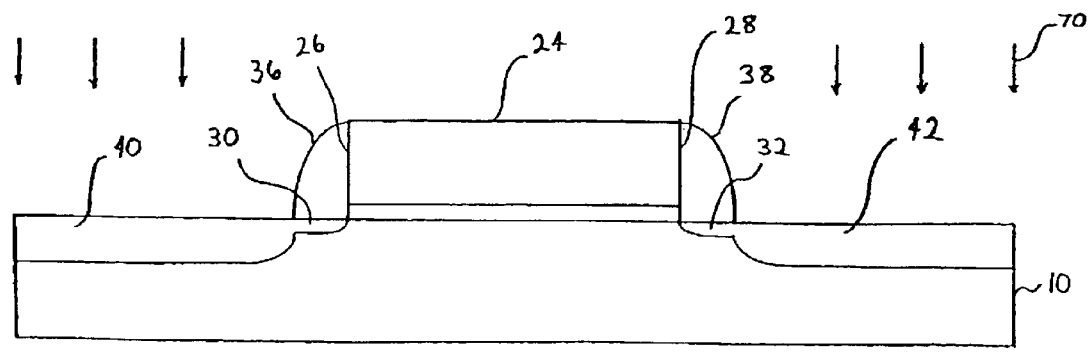

In FIG. 1F, after implantation of the source/drain regions 40, 42, these regions are activated using a laser thermal annealing process. The energy from the laser, represented by arrows 70, is applied to liquefy the substrate 10 to the desired depth of source/drain regions 40, 42. An example of a laser capable of providing this energy is a spatially homogenized 308 nm XeCl pulsed laser, although the invention is not limited in this manner, and the energy and power of the laser can vary in accordance with different applications. Typically, the source/drain regions 40, 42 extend down from the surface of the silicon substrate 10 to a depth of about 400 angstroms to about 1000 angstroms.

After the silicon has been melted, which is for approximately 30–100 nanoseconds, the silicon will cool rapidly, within about one microsecond, and the silicon will reform epitaxially. In so doing, damage caused by the implant process will be removed. The energy fluence of the laser at the surface determines the melt duration that occurs at the surface, and melt duration is related to maximum melt depth. The relationship between melt time and maximum melt depth depends on the temporal profile of the laser beam. Precise control of junction depth is possible due to the capability of measuring the full width height maximum (FWHM) of the laser and the surface melt duration during the process. Relatively large changes in the energy fluence are required to create small changes in the maximum melt depth. The dosage is controlled by the total melt time. The total melt time can be varied by varying the number and/or energy of the laser pulses. For example, a fluence range of approximately 750 mJ/cm$^2$ to 1.3 J/cm$^2$ results in junction depths ranging from 200 to 1500 angstroms from a 308 nm excimer laser at a 9 Hz repetition rate.

The fluence range for laser irradiation can extend all the way from about 50 mJ/cm$^2$ to about 1.3 J/cm$^2$. However, the fluence of the laser can be controlled to melt only to a depth that the silicon has been amorphitized because amorphous silicon absorbs energy at a higher rate than crystalline silicon. For example, a fluence of about 400 mJ/cm$^2$ can be used to melt a amorphous silicon and not melt crystalline silicon.

Figure 1G:
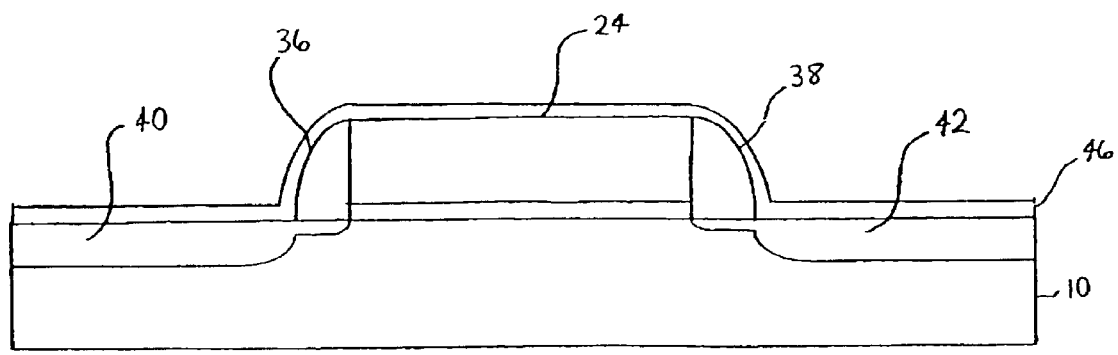

In FIG. 1G, nickel silicide is formed following the creation of the source/drain regions 40, 42. This process involves blanket depositing a layer of nickel 46 over the gate electrode 24 and the source/drain regions 40, 42 of the substrate 10. An illustrative example of a process capable of depositing the layer of nickel 46 is physical vapor deposition (PVD) from a nickel target. The thickness of the nickel layer 46 can be from about 80 to 200 angstroms, and most preferably from about 120 to 180 angstroms.

Figure 1H:
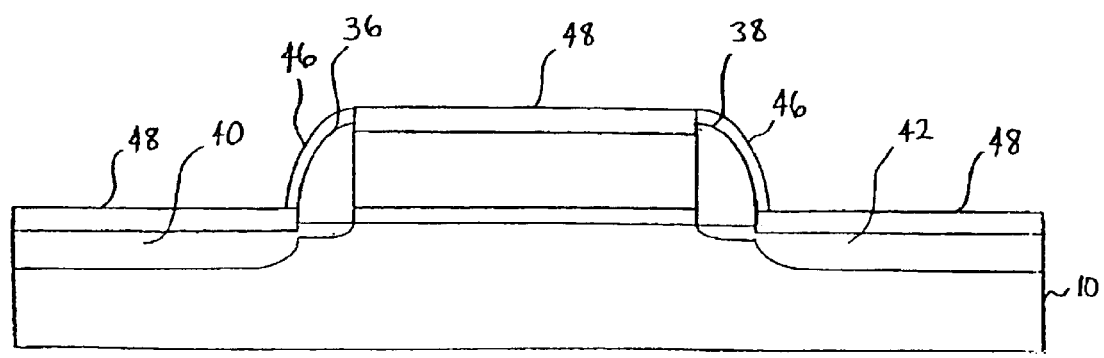
Figure 11:
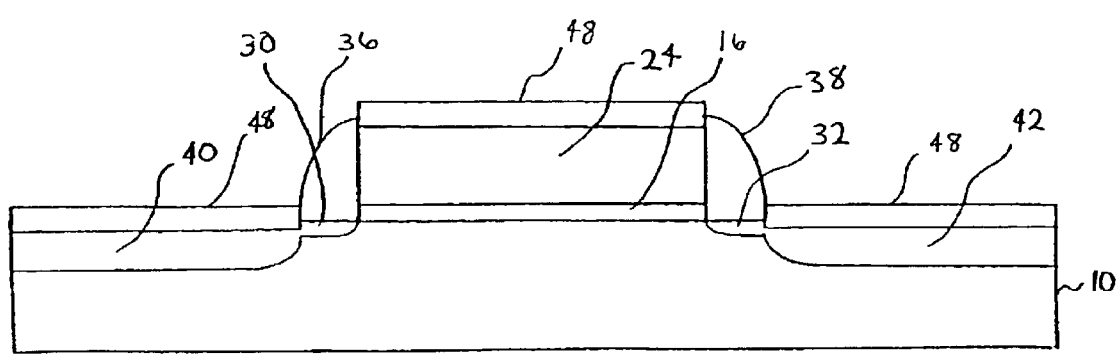

In FIG. 1H, the nickel layer 46 is transformed into nickel silicide 48 by a one-step thermal anneal process, which causes the silicon in the source/drain regions 40, 42 of the substrate 10 or the gate electrode 24 to react with the nickel layer 46 to form a nickel silicide layer 48. The thermal anneal is typically performed for about 30 to 60 seconds at a temperature of about 350 to 500° C. in a nitrogen atmosphere. Although not limited in this manner, the thermal anneal is preferably a furnace anneal. Advantageously, because the thermal anneal is formed at a low temperature, deactivation of the dopants within the source/drain regions 40, 42 is minimized.

In FIG. 1I, the unreacted nickel layer 46 over the sidewall spacers 36, 38 is removed. For example, the unreacted nickel layer 46 can be removed using a wet chemical etch. The wet chemical etch preferably exhibits high selectivity for the unreacted metal 46 relative to the silicide 48. In current embodiments of the invention, the etch is a sulfuric peroxide mixture $H_2SO_4:H_2O_2$ (3:1) with deionized $H_2O$ at a temperature of about 100° C. The removal rate of nickel at the 3:1 ratio is about 10,000 angstroms/minute.

By forming nickel silicide over the source/drain regions, which are activated by laser thermal annealing, the source/drain regions are subjected to a low post-activation temperature furnace annealing process. Advantageously, this low-temperature process reduces deactivation of dopants within the source/drain regions.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:

forming a gate electrode over a substrate and a gate oxide between the gate electrode and the substrate;

implanting dopants within the substrate to form source/drain regions in the substrate proximate to the gate electrode;

laser thermal annealing to activate the source/drain regions; and forming a nickel silicide layer disposed on the source/drain regions after the laser thermal annealing of the source/drain regions.

2. The method of manufacturing a semiconductor device according to claim 1, wherein said nickel silicide forming step includes a step of annealing at temperatures below a temperature at which deactivation of the dopants in the source/drain regions occur.

3. The method of manufacturing a semiconductor device according to claim 2, wherein the temperature of said nickel silicide formation step is from about 350 to 500° C.

4. The method of manufacturing a semiconductor device according to claim 1, wherein said nickel silicide forming step includes a step of depositing about 80 to 200 angstroms of nickel over the source/drain regions.

5. The method of manufacturing a semiconductor device according to claim 1, further comprising steps of forming source/drain extensions in the substrate adjacent to the gate electrode and forming sidewall spacers adjacent to the gate electrode.

6. The method of manufacturing a semiconductor device according to claim 5, wherein the source/drain extensions have a depth of about 50 to 300 angstroms.

7. The method of manufacturing a semiconductor device according to claim 5, wherein the source/drain regions have a depth of about 400 to 1000 angstroms.

8. The method of manufacturing a semiconductor device according to claim 1, wherein said step of forming source/drain regions amorphitizes a region in the substrate.

9. The method of manufacturing a semiconductor device according to claim 8, wherein said step of activating the source/drain regions by laser thermal annealing melts the amorphitized region and not crystalline silicon.

10. The method of manufacturing a semiconductor device according to claim 1, wherein the semiconductor device is a MOSFET.

11. A method of manufacturing a MOSFET semiconductor device, comprising the steps of:

forming a gate electrode over a substrate and a gate oxide between the gate electrode and the substrate;

forming source/drain extensions in the substrate adjacent to the gate electrode at a depth of about 50 to 300 angstroms;

forming first and second sidewall spacers adjacent to the gate electrode;

implanting dopants within the substrate to form source/drain regions in the substrate adjacent to the sidewall spacers at a depth of about 400 to 1000 angstroms;

laser thermal annealing to activate the source/drain regions;

depositing a layer of nickel over the source/drain regions after the laser thermal annealing of the source/drain regions; and annealing at temperatures from about 350 to 500° C. to form a nickel silicide layer disposed on the source/drain regions.

* * * * *